United States Patent
Nygard

[19]

[11] Patent Number: 6,153,882
[45] Date of Patent: Nov. 28, 2000

[54] METHOD AND SYSTEM FOR READING A DATA SIGNAL EMITTED BY AN ACTIVE PIXEL IN A SENSOR

[75] Inventor: Einar Nygard, Haslum, Norway

[73] Assignee: Integrated Detector & Electronics AS, Hovik, Norway

[21] Appl. No.: 09/084,939

[22] Filed: May 28, 1998

[30] Foreign Application Priority Data

Jul. 4, 1997 [IL] Israel ....................................... 121238

[51] Int. Cl.$^7$ ....................................... G01T 1/24
[52] U.S. Cl. ....................................... 250/370.09
[58] Field of Search ....................................... 250/370.09

[56] References Cited

U.S. PATENT DOCUMENTS

| 5,023,455 | 6/1991 | Vanstraelen . | |
| 5,378,902 | 1/1995 | Pankove et al. . | |
| 5,452,001 | 9/1995 | Hosier et al. . | |
| 5,567,944 | 10/1996 | Rohe et al. ........................ | 250/370.09 |
| 5,572,329 | 11/1996 | Otsubo et al. . | |
| 5,619,040 | 4/1997 | Shapiro et al. .................... | 250/370.09 |

FOREIGN PATENT DOCUMENTS 0344866  12/1989   European Pat. Off. .
9823974   6/1998   WIPO .

*Primary Examiner*—Constantine Hannaher
*Attorney, Agent, or Firm*—Browdy and Neimark

[57] ABSTRACT

A method for reading a data signal emitted by an active pixel in a sensor having a plurality of addressable pixels, comprising the steps of (a) grouping the plurality of pixels into at least two groups each having a fraction of the plurality of addressable pixels, (b) identifying an active group of addressable pixels in which the active pixel is located, (c) providing a reading circuit for the active group of addressable pixels, and (d) reading a magnitude of the data signal in respect of each pixel in the active group of addressable pixels so as to identify the active pixel. A system uses such a method for reading a data signal emitted by an active pixel in a sensor module having a plurality of addressable pixels arranged into at least two groups, and comprises an identifying circuit commonly coupled to each group of pixels and responsive to the data signal for identifying an active group containing the active pixel without identifying the active pixel itself. A reading circuit is responsively coupled to the identifying circuit for reading a magnitude of the data signal in respect of each pixel in the active group, so as to identify the active pixel.

25 Claims, 6 Drawing Sheets

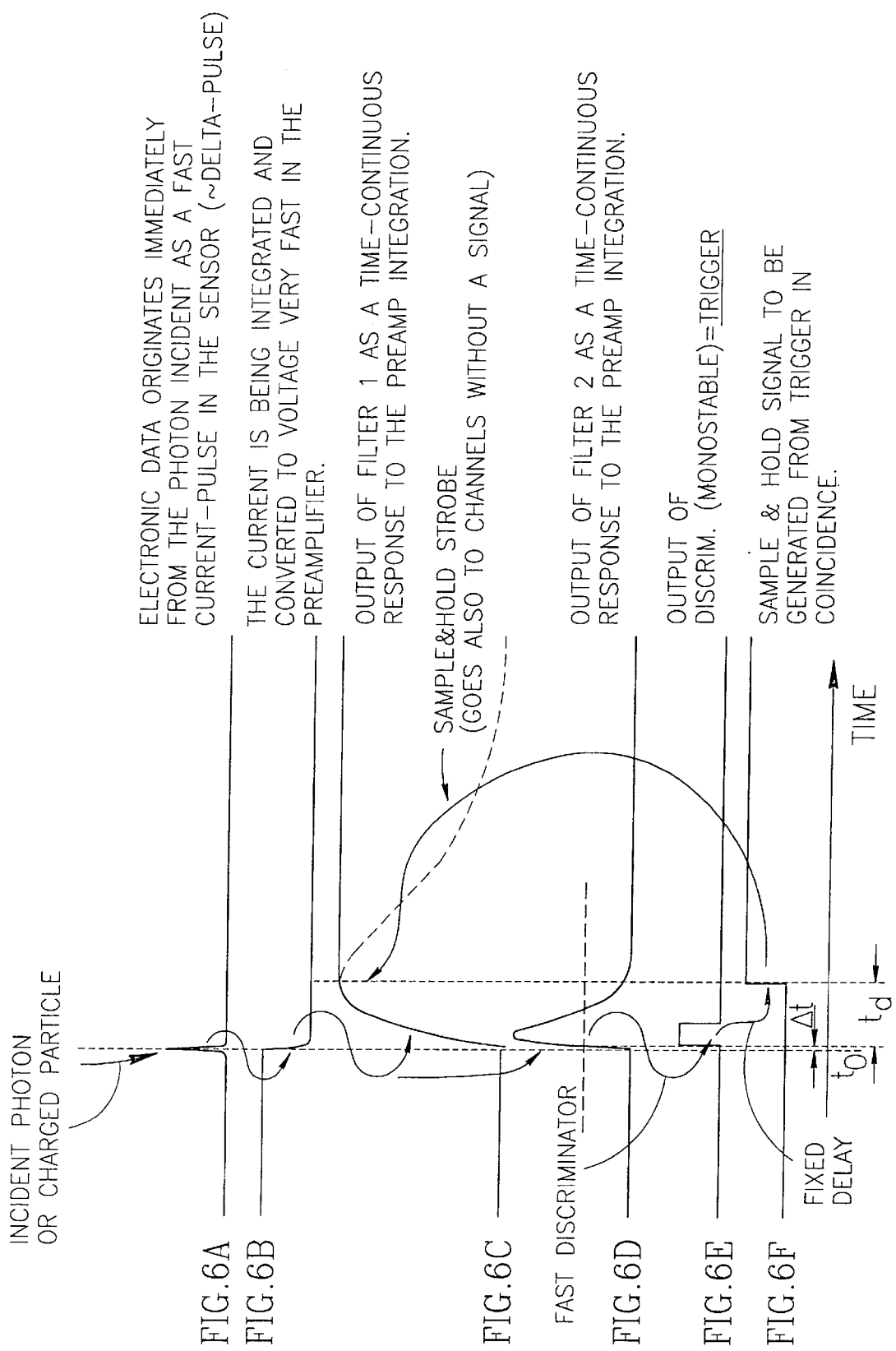

METHOD AND SYSTEM FOR READING A DATA SIGNAL EMITTED BY AN ACTIVE PIXEL IN A SENSOR

FIELD OF THE INVENTION

This invention relates to a method for reading a data signal associated with an active pixel in a sensor having a plurality of addressable pixels in such a manner to optimize the reading efficiency.

BACKGROUND OF THE INVENTION

A known diagnostic technique used in tomography for locating tumors involves injecting into a patient's bloodstream a radioactive isotope which targets the tumor, so that the location of the tumor can be derived by detecting the location of the radioactive isotope. Typically, the radioactive isotope emits high energy γ-rays which are dispersed from the tumor site. In order to achieve the desired detection so as to determine the precise location of the tumor, it is necessary to image the patient's body in such a manner as to detect only those γ-rays which are emitted normally from the body and to ignore those γ-rays which are dispersed in other directions.

Known prior art approaches to achieving this requirement, include the use of a mechanical collimator made out of lead having a plurality of spaced apart holes which are sufficiently narrow in diameter to allow only those γ-rays to pass which are emitted parallel to the collimator holes. The collimator is moved until a signal is detected whereupon the location of the collimator allows the location of the radioisotope to be inferred. However, since most of the radioactive energy is dispersed and therefore not detected, such an approach is highly inefficient and the detector requires lengthy exposure time which is expensive in terms of the time required to perform a reliable measurement as well as being uncomfortable for the patient. The resolution of such a system depends on the diameter of the holes in the collimator and is typically 8 mm. It can be improved be reducing the diameter of the holes in the collimator at the expense of decreasing even further the efficiency which is in any case typically no better than $10^{-5}$.

It is obviously desirable to reduce the measurement time as far as possible without compromising on the detection accuracy. This requirement has been partially addressed by the use of a Compton camera using ring geometry so that scattered photons are detected by the ring rather than being lost as is the case with mechanical collimators. This obviates the need for a collimator and allows the angle of emanation of the γ-rays to be calculated. For the purpose of the present invention which is not concerned with the physics of the Compton effect, the Compton camera may be regarded as just another type of 2-dimensional image sensor having a plurality of addressable pixels, one of which emits a signal when stimulated by a γ-ray. Specifically, each pixel is a diode which generates a charge signal when hit by a γ-ray. A γ-ray emitted by the radioisotope will be detected only if it creates a Compton effect by creating a charge signal thereby giving up some of its energy. In practice, it is usual to employ a composite sensor having several spaced-apart sensor layers each containing at least one sensor module so as to increase the probability that an incident γ-ray will produce a Compton effect in at least one of the layers. The multilayer sensor module constitutes a first detector of the Compton camera. Having thus produced a Compton effect, the γ-ray then emerges from the first detector. However, in order to calculate the angle of the incident γ-ray, the emergent γ-ray is directed to a second detector in which it is absorbed completely, thereby giving up all of its residual energy.

As a result of such a geometry, it is necessary to read out data in the first detector from a large number of addressable pixels along respective channels in order to detect which pixel is "active". This is done by first integrating the charge associated with each pixel using an integrator in the form of an operational amplifier (OP AMP) having a feedback capacitor. The integrated charge pulse is then amplified and shaped and the resulting analog signal is sampled and held, allowing its magnitude to be measured. In order to measure the peak magnitude of the shaped signal, the shaped signal must be very accurately sampled at the peak value. This requires an accurate determination of the peak time which occurs a fixed time difference $t_P$ after the emission of charge by the excited pixel. The fixed time difference $t_P$ is a function of the RC time constant of the shaper circuit and is therefore known.

Thus, in order to know when to sample the integrated charge signal, the time of occurrence $t_o$ of each charge emission must itself be accurately determined. This having been done, all that is then necessary is to sample the held integrated charge sample at a time $t_P$. A reading system for reading out the charge signals must therefore generate an accurate trigger coincident with the occurrence of each charge emission. Self-triggering systems are known in which the channel in which the charge emission occurs generates the trigger by means of a level-sensitive discriminator. The pulse height is also latched so that it can be read out. However, such a system provides information regarding the pulse height only in the specific channel in which the charge emission occurred and not in other channels, except sometimes in the nearest neighboring channels. Moreover, no data is provided relating to the time of occurrence of the charge emission.

It is also known to generate the trigger by means of a separate electronic device on the common "back plane" of the image sensor. However, such an arrangement constrains the image sensor to being a "single-sided" detector rendering it impossible to determine where, in the sensor, the charge emission occurred, as well as being impractical to implement.

Obviously, if during every scan of the composite image sensor, each pixel is read sequentially only one at a time, then the current scan can be terminated when an "active" pixel is detected. However, it is impractical to read each pixel in such a manner because of the time overhead involved in addressing each pixel separately and downloading the pixel data along a dedicated channel for further processing. Furthermore, it will be appreciated that in addition to the one pixel with which the γ-ray stimulation is associated, the other pixels too emit noise. Such noise may occur, for example, owing to the common mode drift of the OP AMPs associated with the reading circuit. When pixels are read only one at a time, it is difficult to quantify accurately the common mode noise component in the "active" pixel. Such considerations militate against addressing each pixel separately and favor batch addressing of a plurality of pixels in a single read operation using multiple channels each in respect of a corresponding pixel. This adds to the expense of the reading circuit, since various components thereof must be repeated for each channel. Having thus read a large number of data signals on separate channels each in respect of one pixel in the image sensor, it is then necessary to process the data in order to determine which pixel is "active", whereupon the location of the radioisotope may be inferred.

Moreover, as explained above, a non-zero common mode noise signal is associated with all of the pixels, including the "active" pixel. In order to measure the "active" pixel data accurately, the average common mode noise must be determined and subtracted from the "active" pixel data itself. This adds to the processing time and, obviously, the more pixels are processed simultaneously, the more time-consuming is the required processing.

Consequently, there is trade-off between reading the data sequentially pixel by pixel, with the consequent high addressing time and inability to compensate for common mode noise; and reading too many pixels simultaneously, with the consequent high processing time and added expense.

Yet a further consideration relates to establishing time coincidence of γ-ray stimulated emissions in the two parallel detectors of a Compton camera. As has been explained above, in order to calculate the angle of the incident γ-ray, the emergent γ-ray from the first detector is directed to a second detector in which it is absorbed completely, thereby giving up all of its residual energy. It is obviously necessary to correlate events in the two detectors in order to establish that they derive from the same γ-ray. This is done by establishing that the two events are substantially simultaneous. However, accurate time coincidence of the two events can be determined accurately only if the γ-ray emission is measured fast. Prior art detectors employ a filter having a slow time constant for shaping the data signal resulting from the γ-ray emission. A slow time constant is necessary to improve signal to noise ratio and to improve locking on to the peak value of the shaped signal. However, using a slow time constant detracts from the accuracy with which the peak time can be measured and this, in turn, reduces the accuracy with which time coincidence of corresponding events in two detectors can be established.

There is therefore clearly a need to optimize the reading of an array of pixels in a 2-dimensional image sensor so as to reduce the time taken to detect a single "active" pixel. Associated with this need is the requirement to provide an accurate trigger when a charge emission occurs so as to determine the time of emission (and thus the peak time) accurately thereby permitting time coincidence of events in more than one detector to be properly established, and to eliminate the effect of common mode noise from "active" pixel data so that only the actual data is read.

SUMMARY OF THE INVENTION

It is therefore an object of the invention to provide a method and system for reading an "active" pixel in a 2-dimensional image sensor or a stack of spaced apart image sensors each having a plurality of pixels.

According to a broad aspect of the invention there is provided a method for reading a data signal emitted by an active pixel in a sensor having a plurality of addressable pixels, the method comprising the steps of:

(a) grouping said plurality of pixels into at least two groups each having a fraction of said plurality of addressable pixels, (b) identifying an active group of addressable pixels in which the active pixel is located, (c) providing a reading circuit for said active group of addressable pixels, and (d) reading a magnitude of the data signal in respect of each pixel in said active group of addressable pixels so as to identify the active pixel.

According to another aspect of the invention, there is provided a system for reading a data signal emitted by an active pixel in a sensor having a plurality of addressable pixels arranged into at least two groups, the system comprising:

identifying means commonly coupled to each of said groups of pixels and responsive to said data signal for identifying an active group containing the active pixel without identifying the active pixel itself, a reading circuit responsively coupled to the identifying means for reading a magnitude of the data signal in respect of each pixel in the active group, so as to identifying the active pixel.

Thus, the invention provides a compromise between reading each pixel sequentially one at a time with the consequent overhead in pixel addressing and lack of common mode noise correction; and reading all pixels simultaneously with the consequent overhead in processing Specifically, in the invention, all the addressable pixels are divided into groups and in a first step only the active group containing the "active" pixel is identified. This can be done very quickly by using a threshold comparator for each pixel in a selected group and wire OR-ing the outputs of all the comparators to discriminate whether the output of the group of pixels exceeds a predetermined threshold. Having thus identified the active group, only the pixels in this group are now read sequentially, one at a time, so as to identify the "active" pixel, whereupon the location of the radioisotope may be inferred. Specifically, such an approach obviates the need to read the pixels in the non-active groups, thereby saving considerable reading time.

In the active group only the "active" pixel will have a signal level exceeding the discriminating threshold. However, the remaining pixels give rise to common mode noise which also affects the "active" pixel and must therefore be compensated for, in order that the common mode noise component may be eliminated from the signal level of the "active" pixel. By reading the signal levels of the remaining pixels in the active group, the average common mode noise level may be determined for the non-active pixels and subtracted from the data signal in respect of the "active" pixel.

Preferably, the data signal is a fast rising current pulse derived from an emission of electric charge consequent to the pixel being struck by a γ-ray. The current pulse is integrated by a preamplifier so as to produce an analog voltage step having a sharp change in level upon emission of the data signal. The voltage step constitutes an initiation signal indicative of the time of emission to and whose magnitude is proportional to the accumulated charge produced by the current pulse and which is collected by a feedback capacitor in the preamplifier. The reading circuit further includes at least one shaper in respect of each pixel in the active group which is responsive to the voltage step for amplifying and shaping the integrated charge in order to generate a slowly rising analog voltage signal having a high signal to noise ratio. An important feature of such an embodiment resides in the precision with which the shaped analog voltage signal is sampled at its peak. Specifically, the reading circuit includes in respect of each pixel in the active group:

a fast shaper having a fast time constant and being responsive to said data signal for shaping the data signal so as to generate a fast response curve which quickly rises above a predetermined threshold, a slow shaper having a slow time constant and being responsive to said data signal for shaping the data signal so as to generate a slow response curve having high signal to noise ratio, delay means coupled to the fast shaper for determining a time delay $\Delta t$ for the fast response curve to exceed said predetermined threshold, and sampling means coupled to the delay means and to the slow shaper for sampling the slow response curve at a further time interval $t_P-\Delta t$ where $t_P$ is the time at which the slow response curve reaches its peak value so as to sample the slow response curve substantially at its peak value.

BRIEF DESCRIPTION OF THE DRAWINGS

In order to understand the invention and see how the same may be carried out in practice, a preferred embodiment will now be described, by way of non-limiting example only, with reference to the accompanying drawings, in which:

FIGS. 6a to 6f show graphically various waveforms associated with the reading circuit all drawn to a common time base.

DETAILED DESCRIPTION OF PREFERRED EMBODIMENTS

Figure 1A:
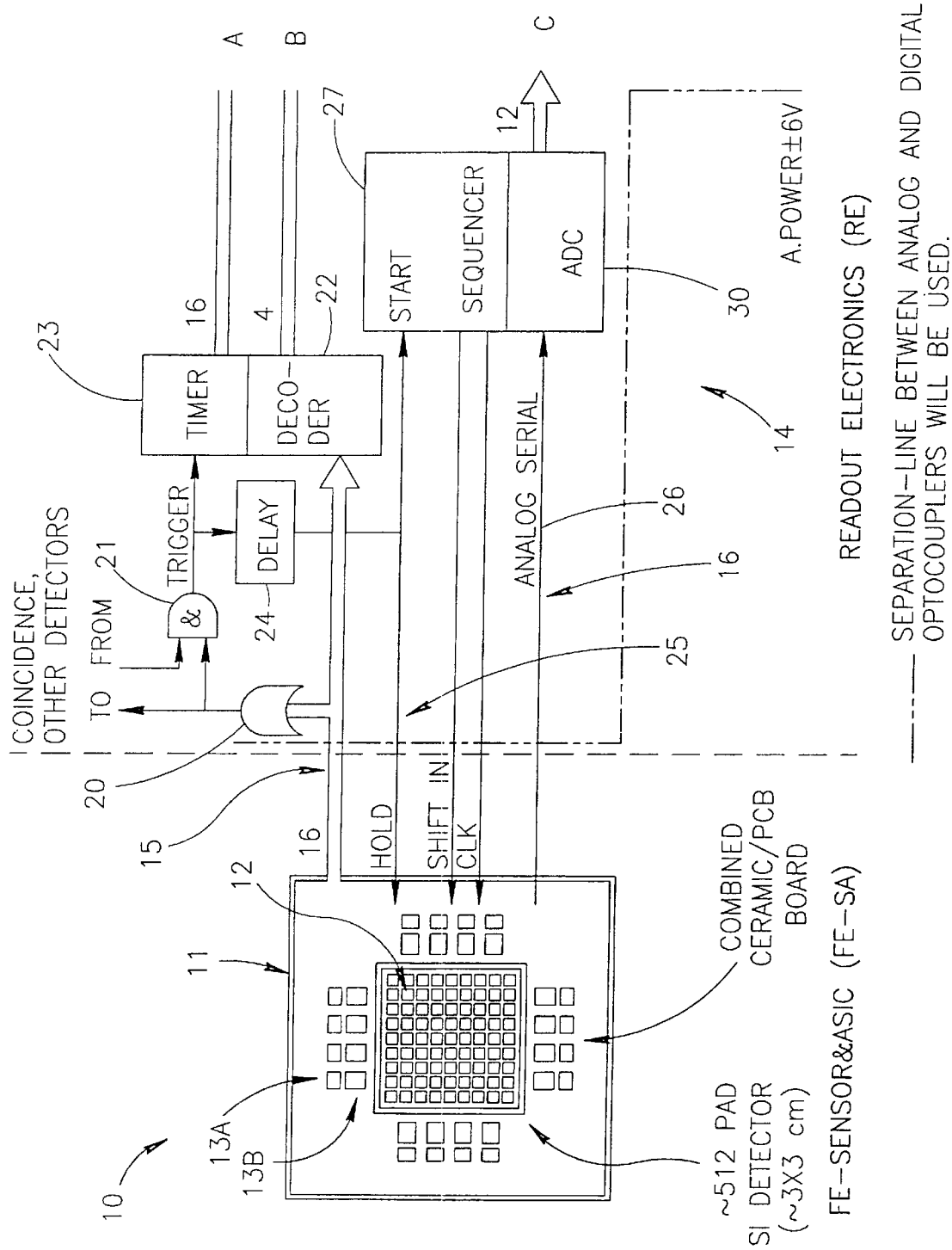
FIGS. 1A and 1B are schematic diagrams showing a system including a reading circuit for reading a sensor according to the invention.
Figure 1B:
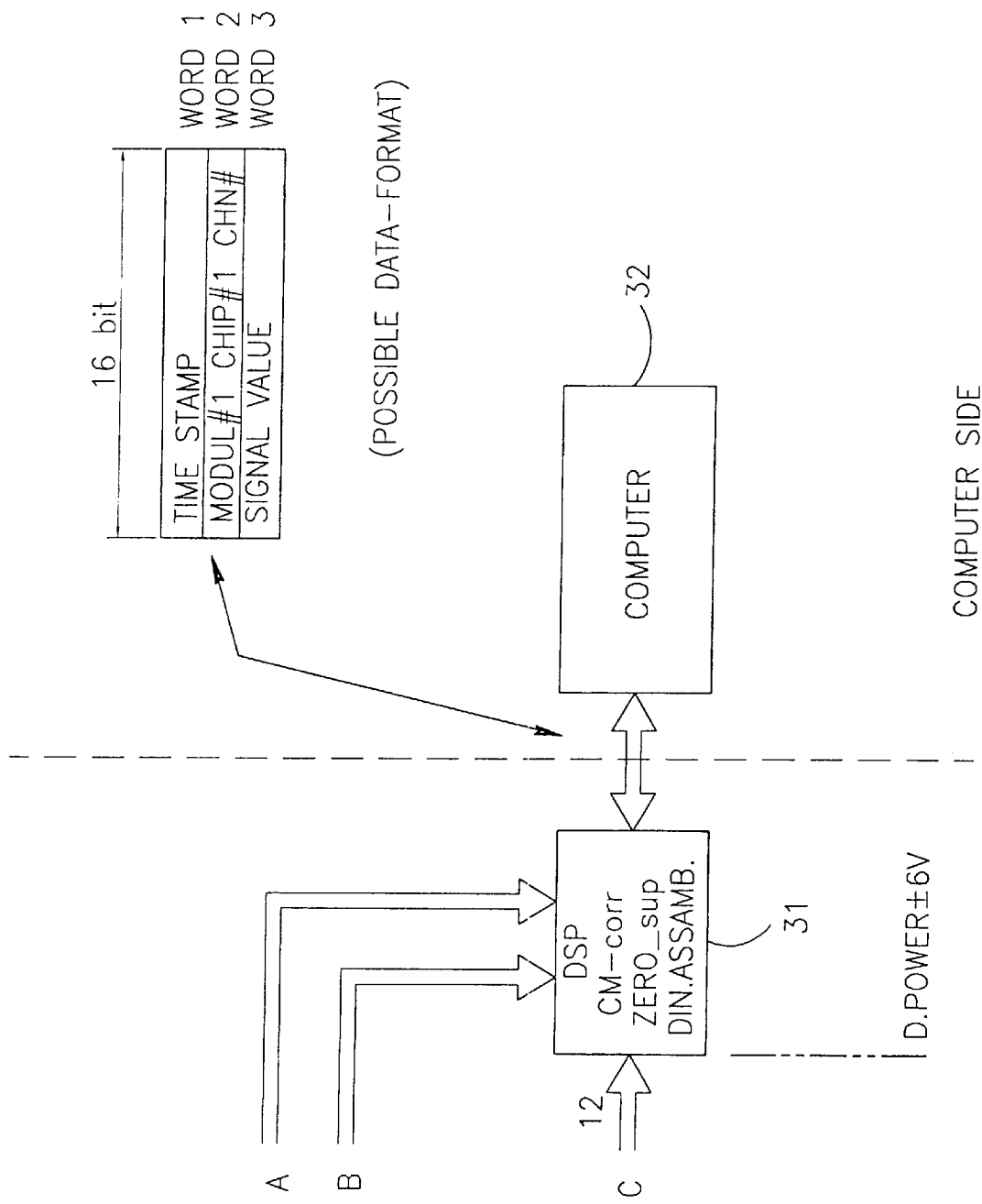

FIGS 1A and 1B are schematic diagrams showing a system depicted generally as 10 comprising a sensor module 11 having an array of 512 pixels 12 constituted by silicon diodes which are responsive to an incident γ-ray for producing a charge signal. By way of example, the sensor module 11 may be part of a Compton camera for use in tomographic imaging of a patient's body. Such a Compton camera is provided with two separate detectors: one of which is a multilayer sensor whose multiple layers serve to increase the Compton effect and each of which is provided with its own independent readout circuit for enabling the data signal to be read out. The second detector, which is not itself a feature of the invention, may be a similar pixel array or any other suitable sensor for absorbing the γ-ray which emerges from the first detector. As a result, the γ-ray gives up its residual energy in the second detector thereby allowing the angle of the γ-ray to be calculated in known manner.

The present invention is thus applicable primarily to the first detector in which the pixel arrays 12 are arranged into 16 groups of pixels each having 32 pixels. The sensor module 11 includes on-chip discrimination circuitry in respect of each of the 16 groups of pixels in the pixel array 12, in the form of a pair of application specific integrated circuits (ASICs) 13a and 13b which may, if desired, be combined in a single ASIC. Details of the ASICs 13a and 13b are given below with reference to FIG. 5 of the drawings. Respective output channels of the discrimination circuitry are fed to a readout circuit 14 for sequentially selecting a different group of pixels and coupling the pixels in the selected group to respective first and second data buses 15 and 16. Specifically, the pixels in each group are fed to a multi-input discriminator so as to derive a composite signal which is fed to a corresponding data line in the first data bus 15. Thus, the composite signal level is derived from all of the pixels in the respective group and is HIGH if any of the pixels in the group is "active" and is otherwise LOW. Consequently, only one data line will be HIGH indicating which of the 16 groups of pixels is "active" whilst the other 15 data lines corresponding to the remaining 15 groups containing, in total, some 480 pixels are inactive are LOW, showing that none of the 480 pixels is "active". Thus, by grouping the 512 pixels as described into 16 groups and discriminating between the one active group and the remaining 15 inactive groups, the location of the one "active" pixel is very significantly narrowed down; although of course, at this stage, it is not yet known which of the 32 pixels in this group is the "active" pixel.

All 16 data lines in the first data bus 15 are connected to respective inputs of a 16 input OR-gate 20 (constituting a first logic means) whose output is consequently HIGH (constituting a first logic level) if any one or more of the 16 data lines is HIGH indicating that the corresponding group is "active". If none of the 512 pixels in the sensor module 11 is "active", then the output of the OR-gate 20 is LOW (constituting a second logic level). As will be explained below, with particular reference to FIG. 2 of the drawings, several sensor modules may be assembled so as to form a multi-layer image sensor each having a plurality of sensor modules. Each sensor module has an associated OR-gate 20 and the output of the OR-gate in each module is fed to one input of a 2-input AND-gate 21 to whose second input is fed an output from a second detector. Consequently, the output of the AND-gate 21 in each sensor module is HIGH only if the outputs of at least one of the OR-gates 20 in the respective sensor module is HIGH, and at the same time the output of the second detector is HIGH. The AND-gate 21 thus allows time coincidence of charge emissions emanating from both the first and second detectors to be established in real time. A γ-ray may strike the image sensor obliquely and if it is partially absorbed in one layer then its angle will change thus permitting its subsequent detection.

A decoding means 22 is coupled to the first data bus 15 and is responsive to the composite signal on each of the data lines thereof for determining which of the data line is HIGH thereby establishing an identity of the active group. A timing means 23 is coupled to the output of the OR-gate 20 via the AND-gate 21 and is responsive to the output of the OR-gate 20 being HIGH (i.e. the first logic level) for generating a time stamp corresponding to a time of creation of the first logic level which is substantially coincident with the pixel response. A delay gate 24 (constituting a delay means) coupled to the timing means 23 is responsive to the output of the OR-gate 20 being HIGH for generating a time delay $t_D$ which is fed via a delay line 25 to a latch in a sample and hold circuit (not shown) within the ASIC 13 so that the data signal generated by the "active" pixel may be sampled at a time delay $t_P=\Delta t+t_D$ after its generation, $\Delta t$ being the time difference between the actual charge emission and its discrimination.

The second data bus 16 is constituted by an analog data line 26 which is coupled via a sequencer 27 (constituting a selection means) to each of the pixels in a selected one of the groups for receiving thereon respective signal levels of each of the pixels in the selected group. The sequencer 27 is responsive to a start signal which is fed to a start input thereof via the delay line 25 for cycling through the pixel addresses in the active group so as to output serially on the analog data line 26 an analog signal corresponding to the signal level of each pixel in turn in the active group. The analog data line 26 is coupled to an analog-to-digital converter (ADC) 30, the output of which is a digital signal representative of the signal level of the corresponding pixel in the active group.

The digital signal output by the ADC 30 is fed to a digital signal processor (DSP) 31 (constituting a discriminating means) which is programmed to compare the signal level of each pixel in the selected group with a discriminating threshold so as to identify the active pixel as that pixel whose signal level exceeds the discriminating threshold.

The DSP 31 also functions as a common mode noise level determination means for determining an average common mode noise level associated with the 31 pixels in the selected group whose signal levels are not commensurate with an "active" pixel. The common mode noise levels of the 31 inactive pixels is averaged and then subtracted from the signal level of the "active" pixel so as to correct for common mode noise. The DSP 31 produces a digital data stream containing data representative of the module number, the active group identity, the active pixel identity, the time stamp of the active pixel and the common mode noise-corrected signal level thereof. The resulting digital data stream is then transmitted to a computer 32 where it is processed as required: this not being a feature of the present invention. The module number is a pre-programmed code which is downloaded into the corresponding sensor module 11 and which thus identifies from which sensor module a data signal was emitted. The time stamp specifies the time based on a common real time clock (not shown) at which a charge emission occurred by the identified pixel. These data are relevant when coincident data from the first detector is combined with the corresponding data from the second detector so as to calculate the location of the incident γ-ray and its angle of incidence. It should, however, be noted that the time stamps are not used to establish time coincidence of a charge emission from the first and second detectors: this being established in real time using logic gates as explained above with reference to FIGS. 1A and 1B of the drawings.

Separate power supplies (not shown) are provided for the analog and digital sections of the reading circuit 14, so that the analog and digital power is distinct as shown by the chain-dotted line. In order to maintain the desired differentiation between analog and digital components whilst nevertheless allowing for unimpeded data transfer between the two, opto-couplers are employed.

Figure 2:
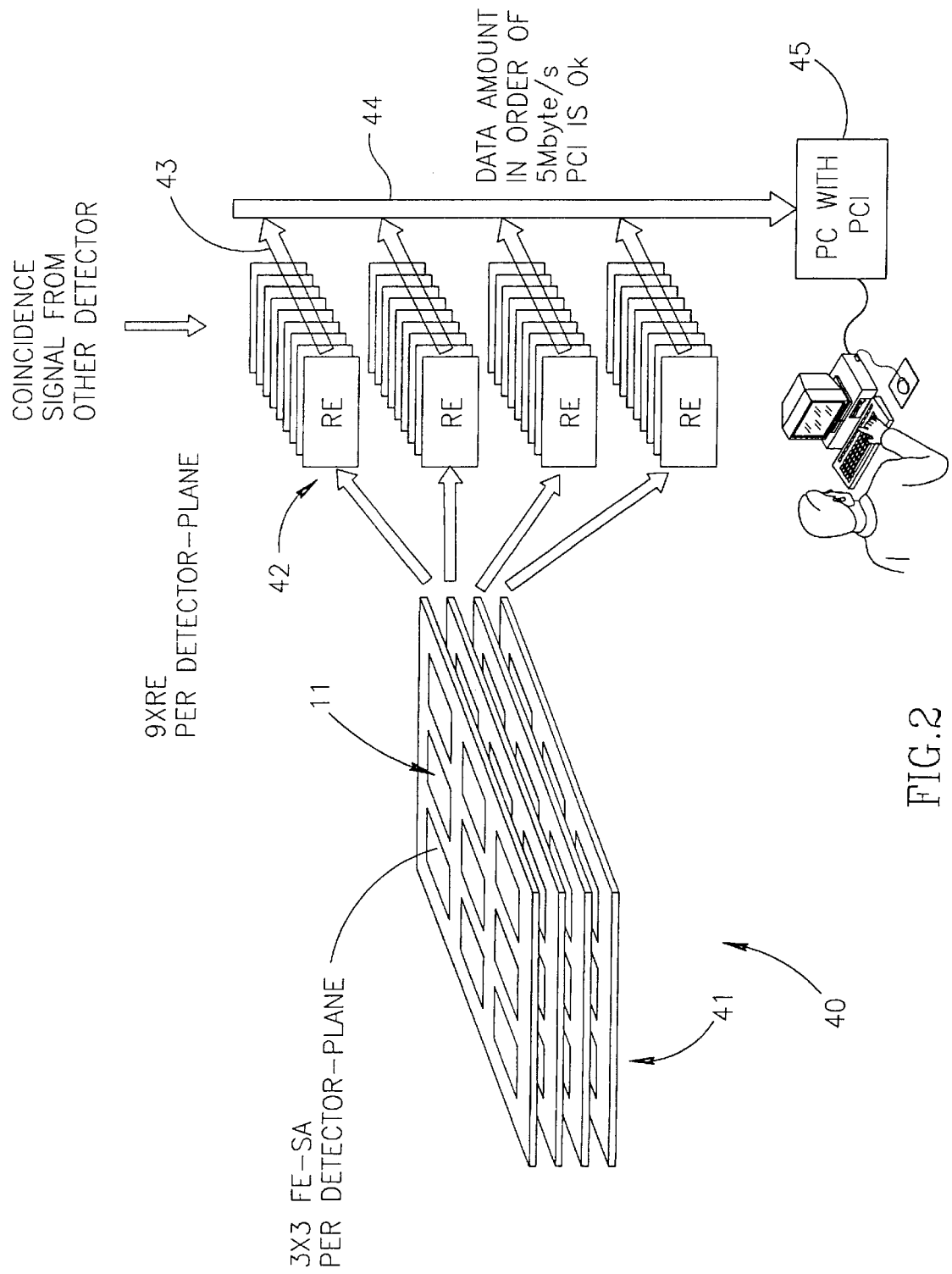
FIG. 2 shows pictorially a multi-layer sensor according to the invention comprising a stacked array of image sensors.

FIG. 2 shows pictorially a multi-layer sensor 40 being part of a first detector for a Compton camera and having five parallel identical sensor planes each designated 41 and comprising an array of nine sensor modules 11 as described above with reference to FIGS. 1A and 1B of the drawings. Each of the sensor modules 11 in each sensor plane 41 is coupled to a respective reading circuit 42, so that nine reading circuits are required for each sensor plane. Respective outputs 43 of each of the reading circuits 42 are coupled via a data bus 44 to a computer 45. A γ-ray impinging on the sensor 40 has sufficient energy to penetrate through all the layers 41 thereof, but produces a charge data signal only if it is partially absorbed by a pixel in at least one sensor plane. As noted above, the provision of multiple layers increases the probability that a Compton effect will occur in at least one pixel of the sensor. It should be noted that the same objective can also be realized by increasing the surface area of each sensor plane.

Figure 3:
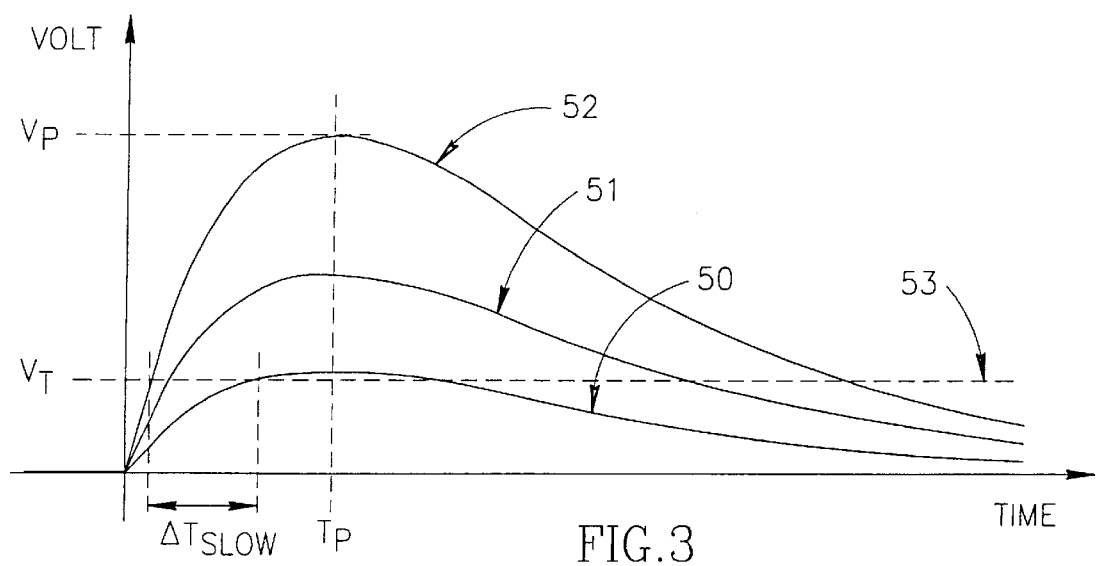
FIG. 3 shows graphically the effect of time walk in an integrated charge signal.

In order that the charge signal emitted by an "active" pixel can be read by the reading circuit 42, the charge signal, after pre-amplification, must first be shaped whereupon its peak magnitude may be sampled and measured. FIG. 3 shows graphically three curves 50, 51 and 52 representing respective charge signals emanating at the same time $t_0$ and each having a different peak value $V_P$.

Referring back to the description of the reading circuit with reference to FIGS. 1A and 1B of the drawings, it will be recalled that a time delay $t_D$ is fed via a delay line 25 to a latch in a sample and hold circuit (not shown) within the ASIC 13a so that the data signal generated by the "active" pixel may be sampled at a time delay $t_P$ after its generation. The time delay $t_D$ may be predetermined based on the value of Δt and the peak time $t_P$ which is known from the RC time-constant of the shaper, so that if the start of the signal at time $t_0$ is known then the curve may be sampled exactly at the peak time $t_P$ so as to obtain the peak value $V_P$. In fact, this is not feasible because the time $t_0$ of the charge signal emanating from the "active" pixel can never be determined precisely since it is first necessary to discriminate between actual pixel data resulting from an incident γ-ray and the signal baseline level. Such discrimination is performed by comparing the signal with a predetermined threshold 53 using a conventional comparator. The time taken for each of the signals to pass the threshold 53 depends on the peak value $V_P$ of the signal and thus varies from one signal to another. This effect is known as "time walk" and must be compensated for in order to sample each of the three signals at the correct time so as to obtain the respective peak value. Without such compensation, there is no constant delay between the time at which each curve passes through the threshold and the time at which the curve reaches its peak value.

Figure 4A:
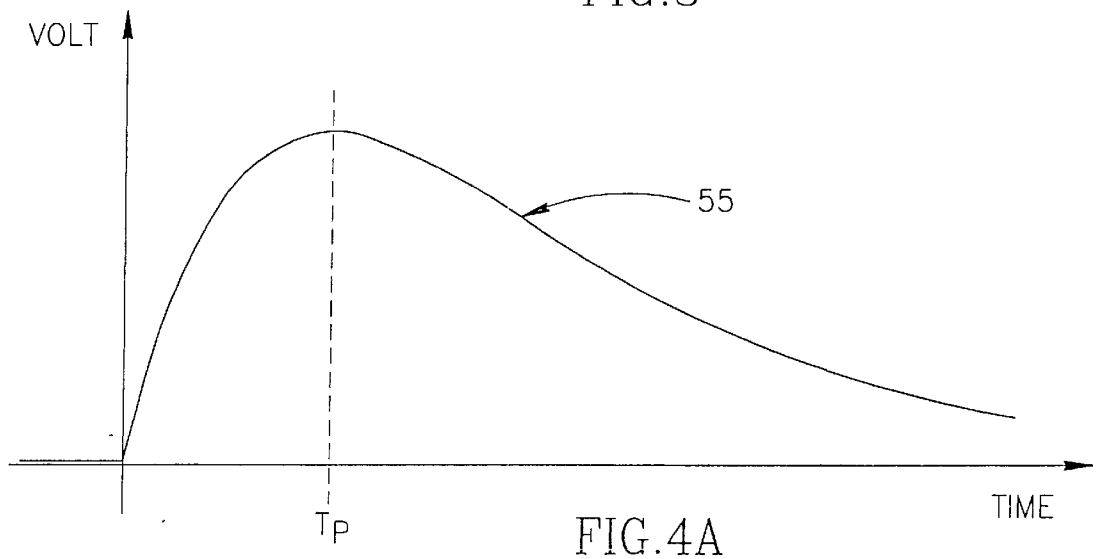
FIGS. 4a and 4b show graphically a solution according to the invention to the problem associated with time walk of an integrated charge signal.
Figure 4B:
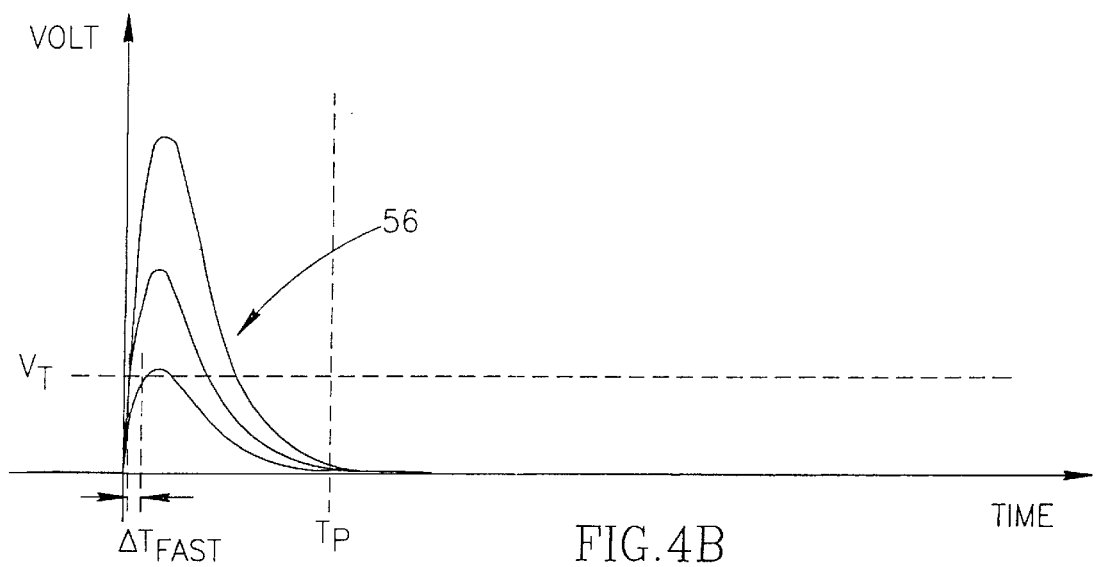

FIGS. 4a and 4b show graphically a solution to the problem of time walk by means of which the desired compensation can be effected. Thus, FIG. 4a shows a typical integrated charge curve 55 having a known peak time $t_P$. As explained above, this in itself is not sufficient to measure accurately the peak value $V_P$ because it is first necessary to determine a reliable time origin to using a threshold discriminator as explained above.

In order to achieve this objective, the invention provides a second shaper having a very much faster time constant so as to produce a sharp curve 56 (shown in FIG. 4b) which crosses the threshold after a time Δt very much less than the peak time $t_P$ of the slow shaper. Having thus determined from the curve 56 that the signal corresponds to pixel data and not the signal baseline level, the first curve 55 may be sampled after a time delay $t_D$ equal to $t_P - \Delta t$. It is, of course, true that Δt is not known precisely because the fast rise time curve 56 is also subject to time walk and therefore Δt depends on the peak value thereof. However, since the value of Δt is very small compared to the value of $t_P$, any error in $\Delta_t$ has negligible effect on the delay $t_P - \Delta t$ after which the first curve 55 is sampled in order to read the value of $t_P$.

Figure 5:
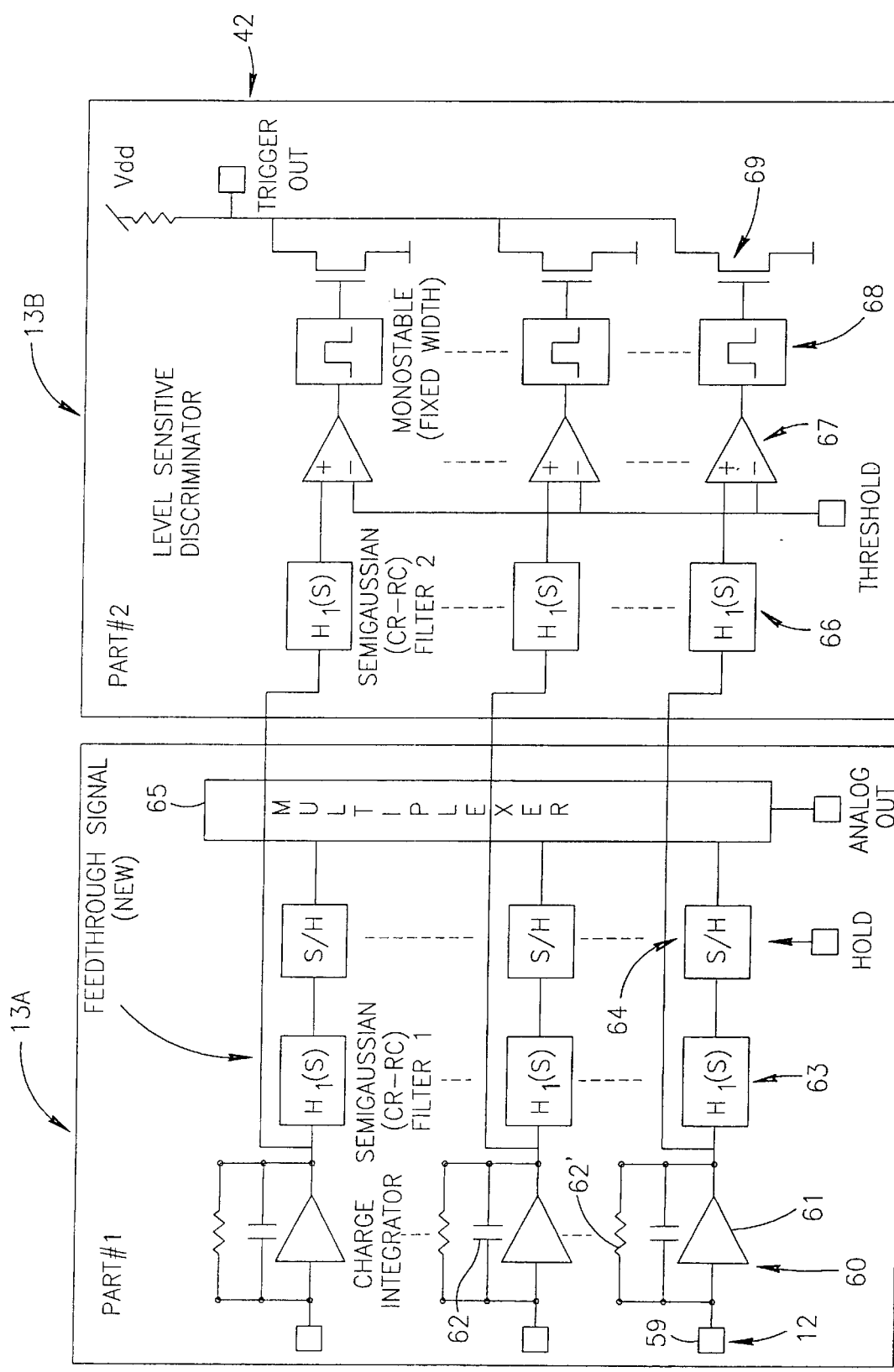
FIG. 5 is a schematic diagram showing a detail of the reading circuit according to the invention.

FIG. 5 shows a detail of the reading circuit 42 illustrating the application of duplicated shapers having different time constants in order to compensate for time walk. To the extent that the reading circuit 42 contains components which are shown in other figures also, identical reference numerals will be employed. Thus, each pixel 12 in a selected group is fed to an integrator 60 formed by a preamplifier 61 having a feedback capacitor 62. The integrated output of the preamplifier 61 is filtered by a first CR-RC shaper 63 (constituting a slow shaper) and then passed to a sample and hold unit 64. The analog output of the sample and hold unit 64 is multiplexed by a multiplexer 65 so that the signal corresponding to each of the 32 pixels in each group can be sampled and processed.

The output of the preamplifier 61 is also fed to a second CR-RC shaper 66 (constituting a fast shaper) having an integration time (i.e. peak time) which is in the order of ten times shorter than that of the first shaper 63. The output of the second shaper 66 is fed to a level discriminator 67 whose threshold is of sufficient magnitude to discriminate between a genuine signal and the signal baseline level. The output of the level discriminator 67 is fed to a monostable 68 whose output is coupled to the gate of a MOSFET 69. The monostable 68 is thus responsive to an "active" pixel within the respective group for producing a short trigger pulse for switching on the MOSFET 69. The MOSFETs 69 of each group are connected in wired OR configuration so that if any of the pixels in the selected group is "active" the combined output of the MOSFETs 69 will be HIGH.

Thus, the second shaper 66 permits very fast discrimination in respect of an "active" pixel whereafter the slow integrated signal generated by the first shaper 63 may be accurately sampled after a constant delay time $t_D$ in order to establish its peak value $V_P$.

FIGS. 6a to 6f summarize the various signal levels associated with an "active" pixel all drawn according to a common time base. Thus, FIG. 6a shows the actual charge signal emitted by a pixel consequent to being struck by a γ-ray. As explained above, this signal is a sharp current pulse starting at time $t_0$, almost instantaneously rising to a peak value and then trailing off to zero.

FIG. 6b represents the corresponding waveform after pre-amplification. As noted above, the preamplifier integrates the charge data signal so as to produce an analog voltage signal having a sharp change in level upon emission of the data signal. The sharp change in level defines the start time to of the data signal.

FIGS. 6c and 6d show respectively the slow and fast shaped data signals. In FIG. 6c, the shaped signal rises to a peak value $V_P$ at a time $t_P$ after the start time $t_0$ and then trails off to zero as shown by the dotted line. The waveform must be sampled and held at the time $t_P$ in order to capture the peak value $V_P$. It is clearly shown in FIG. 6d that the fast shaped signal rises through the threshold after a time interval $\Delta t$ following the start time $t_0$.

FIG. 6e shows the output of the monostable 68 (shown in FIG. 5) which is a sharp square wave pulse generated at time $t_0+\Delta t$ and which is fed via the MOSFET 69 to the delay circuit 24 (shown in FIG. 1A) so as to trigger the delay circuit 24 whereby after a further delay time $t_D$ equal to $t_P-\Delta t$ the slow integrated signal shown in FIG. 6c is sampled at its peak value $V_P$.

It will be appreciated that whilst the use of parallel discrimination using slow and fast shapers has particular benefit to the sensor according to the invention, the principle of parallel discrimination may find more general application. More particularly, it is to be noted that, where high speed is not essential, such discrimination may advantageously be employed with known image sensors all of whose pixels are read out, so as to allow the pixel data to be read with greater accuracy. Likewise, it will be apparent that other modifications may be effected to the particular embodiments as described without departing from the spirit of the invention.

Thus, for example, whilst the invention has been described with particular regard to the detection of γ-ray emissions, it is to be understood that the same principles are equally well applicable for the detection of other high energy particles. As will further be appreciated, such high energy particles may be photons or charged particles.

Likewise, although the use of the multi-pixel sensors within a Compton camera has been described, it is to be understood that the same principles are equally well suited for use with a hybrid photon detector and for readout of photomultiplier tubes.

It should also be pointed out that when the sensor modules are based on silicon, each pixel is effectively a diode. However, other semiconductor sensors may also be employed in which case the pixels are high resistive elements.

I claim:

1. A method for reading a data signal emitted by an active pixel in a sensor having a plurality of addressable pixels, the method comprising the steps of:
   (a) grouping said plurality of pixels into at least two groups each having a fraction of said plurality of addressable pixels,
   (b) identifying an active group of addressable pixels in which the active pixel is located,
   (c) providing a reading circuit for said active group of addressable pixels,
   (d) reading a magnitude of the data signal in respect of each pixel in said active group of addressable pixels so as to identify the active pixel,
   (e) providing an initiation signal when the data signal is emitted by the active pixel, and
   (f) measuring the magnitude of the data signal at a predetermined time interval $t_D$ after said initiation signal so as to read the magnitude of the data signal.

2. The method according to claim 1, further including the steps of:
   (a) comparing the signal in respect of each pixel in the active group with a discriminating threshold, and
   (b) identifying the active pixel as the pixel whose respective signal exceeds said threshold.

3. The method according to claim 1, further including the steps of:
   (a) determining an average common mode noise level associated with each of the pixels in the active group other than the active pixel, and
   (b) subtracting said average common mode noise level from the signal level of the active pixel.

4. The method according to claim 1, for use with a first detector comprising said pixels and in which an incident high energy particle is partially absorbed and emerges therefrom with reduced energy;
   said method further including the steps of:
   (a) providing at least one second detector for totally absorbing the incident high energy particle emerging from the first detector, and
   (b) rejecting a signal in said first detector which has no counterpart in the at least one second detector;
   thereby discriminating between a genuine signal which is detected by both detectors and random noise emitted randomly by said detectors.

5. The method according to claim 1, wherein the data signal is derived from an accumulated charge and there is further included the step of integrating the charge in order to generate a voltage step whose magnitude is proportional to the accumulated charge.

6. The method according to claim 5, including the steps of:
   (a) shaping the charge via a fast shaper having a fast time constant so as to generate a fast response curve which quickly rises above a predetermined threshold,
   (b) simultaneously shaping the charge via a slow shaper having a slow time constant so as to generate a slow response curve having high signal to noise ratio, (c) determining a time delay $\Delta t$ for the fast response curve to exceed said predetermined threshold, and (d) sampling the slow response curve at a further time interval $t_P - \Delta t$ where $t_P$ is the time at which the slow response curve reaches its peak value so as to sample the slow response curve substantially at its peak value.

7. A system for reading a data signal emitted by an active pixel in a sensor module having a plurality of addressable pixels arranged into at least two groups, the system comprising:

an identification circuit commonly coupled to each of said groups of pixels for simultaneously monitoring each of said at least two groups and being responsive to said data signal for identifying an active group containing the active pixel without identifying the active pixel itself, and a reading circuit responsively coupled to the identification circuit for reading a magnitude of the data signal in respect of each pixel in the active group, so as to identify the active pixel, said reading circuit including:

an initiation circuit responsive to said data signal for producing an initiation signal at said start time $t_0$, and a level determination circuit responsively coupled to the initiation circuit for measuring the magnitude of the data signal at a predetermined time interval $\Delta t$ after said initiation signal so as to discriminate between a genuine signal and signal baseline level.

8. The system according to claim 7, wherein the reading circuit comprises:

a discriminating circuit for comparing a magnitude of each data signal with a discriminating threshold so as to identify the active pixel as that pixel whose signal magnitude exceeds said discriminating threshold.

9. The system according to claim 7, further including:

common mode noise level determination means for determining an average common mode noise level associated with said remaining pixels, and common mode noise correction means coupled to the common mode noise level determination means for subtracting said average common mode noise level from the signal level of the active pixel.

10. The system according to claim 7, wherein said sensor module is accommodated within a layer of a multi-layer sensor.

11. The system according to claim 7, wherein the or each sensor module is a component in a first detector in which an incident high energy particle is partially absorbed and emerges therefrom with reduced energy, and there is further provided a second detector for totally absorbing the incident high energy particle emerging from the first detector.

12. The system according to claim 11, further including:

timing means coupled to both the first and second detectors for associating respective time stamps according to a common time base with the "active" pixel in the first detector and with a known location in the second detector at which the high energy particle is absorbed, and computing means coupled to the first and second detectors and being responsive to said time stamps of a data signal emanating from both the first and second detectors substantially simultaneously for computing a location of the "active" pixel and a direction of said high energy particle.

13. The system according to claim 7, wherein:

the electrical signal is emitted as a sharply rising current pulse, and the initiation means comprises a preamplifier including an integration circuit for integrating the current pulse so as to produce an analog voltage step having a sharp change in level upon emission of the electrical signal.

14. The system according to claim 7, wherein the data signal is derived from an emission of electric charge and the reading circuit further includes at least one shaper in respect of each pixel in the active group for shaping the charge in order to generate a proportional voltage signal.

15. The system according to claim 14, wherein each pixel is a semiconductor diode for emitting charge when struck by high energy radiation.

16. The system according to claim 14, wherein each pixel is a high resistive element.

17. The system according to claim 14, wherein the reading circuit includes in respect of each pixel in the active group:

a fast shaper having a fast time constant and being responsive to said initiation signal for shaping the charge so as to generate a fast response curve which quickly rises above a predetermined threshold, a slow shaper having a slow time constant and being responsive to said initiation signal for shaping the charge so as to generate a slow response curve having a high signal to noise ratio, delay means coupled to the fast shaper for determining a time delay $\Delta t$ for the fast response curve to exceed said predetermined threshold, and sampling means coupled to the delay means and to the slow shaper for sampling the slow response curve at a further time interval $t_P - \Delta t$ where $t_P$ is the time at which the slow response curve reaches its peak value so as to sample the slow response curve substantially at its peak value.

18. The system according to claim 17, wherein the fast and slow shapers are provided in a single integrated circuit.

19. The system according to claim 20, including:

a first data bus coupled to each group of pixels in said sensor module for feeding along parallel data lines within said first data bus a composite signal level derived from all of the pixels in the respective group, decoding means coupled to the first data bus and responsive to said composite signal for determining an identity of the active group, first logic means coupled to the first data bus for producing a first logic level if one of the signal levels in said first data bus is commensurate with an "active" pixel and for producing a second logic level otherwise, timing means coupled to the first logic means and responsive to the first logic level for generating a time stamp corresponding to a time of creation of said first logic level, delay means coupled to the timing means and responsive to the first logic level for generating a time delay equal to said time interval $t_P - \Delta t$, a second data bus coupled via a selection means to each of the pixels in a selected one of said groups for receiving thereon respective signal levels of each of the pixels in the selected group, discriminating means coupled to the second data bus for comparing the signal level of each pixel in the selected group with a discriminating threshold so as to identify the active pixel as that pixel whose signal level exceeds said discriminating threshold, common mode noise level determination means coupled to the second data bus for determining an average common mode noise level associated with the pixels in the selected group whose signal levels are not commensurate with an "active" pixel, and processing means coupled to the timing means and to the common mode noise level determination means for determining a common mode noise-corrected signal level of the "active" pixel and for producing a digital data stream containing data representative of the active group identity, the active pixel identity, the time stamp and the common mode noise-corrected signal level.

20. The system according to claim 19, wherein:

an analog to digital converter is coupled to the second data bus for converting the signal levels of the pixels in the selected group to an equivalent digital signal, and the processing means is a digital signal processor.

21. The system according to claim 20, wherein:

said sensor module is accommodated within a first detector in which an incident high energy particle is partially absorbed and emerges therefrom with reduced energy, and there is further provided:

at least one second detector for totally absorbing the incident high energy particle emerging from the first detector, second logic means coupled to an output of the respective first logic means in each sensor module of the first detector and to an output of the at least one second detector for rejecting a signal in said first detector which has no counterpart in the at least one second detector;

thereby discriminating between a genuine signal which is detected by both detectors and random noise emitted randomly by said detectors.

22. The system according to claim 17, wherein the fast and slow shapers are provided in separate integrated circuits each having respective interconnection means.

23. The system according to claim 7, wherein the sensor module is part of a detector in a Compton camera.

24. The system according to claim 7, wherein the sensor module is part of a detector in a hybrid photon detector.

25. The system according to claim 7, wherein the sensor module is part of a photomultiplier tube.

* * * * *